(12) United States Patent
Lin et al.

(10) Patent No.: US 7,064,449 B2
(45) Date of Patent: Jun. 20, 2006

(54) BONDING PAD AND CHIP STRUCTURE

(75) Inventors: Chiu-Shun Lin, Tainan County (TW);
Kuan-Chou Lin, Tainan County (TW);
Chia-Hui Wu, Tainan County (TW);
Pai-Sheng Cheng, Tainan County (TW)

(73) Assignee: Himax Technologies, Inc., Tainan (TW)

( * ) Notice: Subject to any disclaimer, the term of this patent is extended or adjusted under 35 U.S.C. 154(b) by 0 days.

(21) Appl. No.: 10/711,674

(22) Filed: Sep. 30, 2004

(65) Prior Publication Data
US 2006/0006531 A1    Jan. 12, 2006

(30) Foreign Application Priority Data
Jul. 6, 2004    (TW) ............................... 93120184 A

(51) Int. Cl.
*H01L 23/48*    (2006.01)
*H01L 23/52*    (2006.01)
*H01L 29/40*    (2006.01)

(52) U.S. Cl. ...................... 257/786; 257/734; 257/737; 257/784

(58) Field of Classification Search ................ 257/734, 257/737, 784, 786
See application file for complete search history.

(56) References Cited

U.S. PATENT DOCUMENTS

| | | | | | |
|---|---|---|---|---|---|
| 5,053,850 | A | * | 10/1991 | Baker et al. ................. | 257/786 |
| 6,246,587 | B1 | * | 6/2001 | Chen .......................... | 361/773 |
| 6,613,662 | B1 | * | 9/2003 | Wark et al. ................. | 438/613 |
| 6,897,570 | B1 | * | 5/2005 | Nakajima et al. ........... | 257/786 |
| 2004/0166661 | A1 | * | 8/2004 | Lei ............................. | 438/614 |

\* cited by examiner

*Primary Examiner*—Nathan J. Flynn
*Assistant Examiner*—Victor A Mandala, Jr.
(74) *Attorney, Agent, or Firm*—Jiang Chyun IP Office

(57) ABSTRACT

A chip structure and a bonding pad are provided. The chip structure comprises a chip and at least a bonding pad. The chip has an active surface. The bonding pad is disposed on the active surface of the chip. The bonding pad comprises a polygonal body and a plurality of first protruding portions. The polygonal body has a first planar surface and a corresponding second planar surface. The second planar surface of the polygonal body is in contact with the chip. The first protruding portions are disposed on the first planar surface at the corner regions of the polygonal body. By modifying the geometric shape of the bonding pad, the yield of bonding the chip structure and another device together through the bonding pad is increased.

17 Claims, 4 Drawing Sheets

BONDING PAD AND CHIP STRUCTURE

CROSS-REFERENCE TO RELATED APPLICATION

This application claims the priority benefit of Taiwan application serial no. 931 20184, filed Jul. 6, 2004.

BACKGROUND OF THE INVENTION

1. Field of the Invention

The present invention relates to a bonding pad and a chip structure. More particularly, the present invention relates to a bonding pad having different geometric shapes and a chip structure.

2. Description of the Related Art

In the recent decade, electronic technologies have been progressing at a tremendous pace, especially in the technique of fabricating integrated circuits (IC). Electronic devices having multiple functions are produced at an ever-decreasing cost.

In general, semiconductor fabrication can be roughly divided into a front stage and a back stage. The front stage processing includes mask fabrication, oxidation, photolithography, etching, deposition and doping. To establish input/output communication channels between a chip and an external device, bumps are often formed on the input/output bonding pads of a chip.

FIG. 1 is a schematic cross-sectional view of a conventional chip structure. As shown in FIG. 1, the chip structure 100 comprises a chip 120, a bonding pad 140, a bump 180 and a passivation layer 160. The bonding pad 140 is disposed on an active surface 122 of the chip 120 for inputting/outputting signal. The passivation layer 160 is disposed on the active surface 122 but has an opening that exposes the bonding pad 140. The bump 180 is disposed on and electrically connected to the bonding pad 140.

FIG. 2 is a perspective view of the bonding pad in FIG. 1. As shown in FIGS. 1 and 2, the bonding pad 140 has a flat rectangular shape. Using the driving chip of a liquid crystal display as an example, the driving chip is normally bonded to the glass substrate (not shown) of a liquid crystal display by thermal compression. In the process of bonding the chip 120 to the glass substrate through thermal compression, thermal stress are often created between the bumps 180, the bonding pads 140 and the passivation layer 160 due to differences in their coefficient of thermal expansion (CTE). The corner regions of the bonding pads 140 are particularly vulnerable to stress concentration effects.

Therefore, the electrical connection between the bump 180 and the bonding pad 140 is easily damage around the corner region of the bonding pads 140 when the flat top surface of the bonding pad 140 is made to contact the passivation layer 160 and the bump 180. Since the bonding pads 140 are used for transmitting signals into and out of the chip 120, any damage in the electrical connection between the bump 180 and the bonding pad 140 will lead to a drop in the reliability of the entire electronic product. In addition, if the passivation layer 122 cracks under the effect of thermal stress, moisture can easily migrate into the chip 120 to cause possible damages. Hence, it is important to reduce the damage to the chip package 100 due to thermal stress.

SUMMARY OF THE INVENTION

Accordingly, at least one objective of the present invention is to provide a bonding pad capable of strengthening the reliability of electrical connection between the bonding pad and other conductive bodies.

At least a second objective of the present invention is to provide a chip structure capable of strengthening the reliability of electrical connection between the chip structure and other electrical devices.

To achieve these and other advantages and in accordance with the purpose of the invention, as embodied and broadly described herein, the invention provides a bonding pad for disposing on the active surface of a chip. The bonding pad mainly comprises a polygonal body and a plurality of first protruding portions. The polygonal body has a first planar surface and a corresponding second planar surface. Furthermore, the polygonal body is disposed on the chip, and the second planar surface of the polygonal body is in contact with the chip. The first protruding portions are disposed on the first planar surface and positioned at the corner regions of the polygonal body.

In the present embodiment, the bonding pad may further comprise a second protruding portion disposed on the first planar surface and positioned in the central region of the polygonal body. The second protruding portion is connected to the first protruding portions, for example. The shape of the second protruding portion, when viewed from the top against the first planar surface, may be any useful shape, such as a cross-line shape, a circular shape, a circular ring shape, an ellipse shape, an ellipse ring shape, a polygonal shape, a polygonal ring shape or any other linear or geometrical shape, or a shape of any of their combination(s). The polygonal body, the first protruding portions and the second protruding portion are formed together as an integrated unit, for example.

In the present embodiment, the bonding pad is fabricated using aluminum, for example. Furthermore, the polygonal body has a square shape, for example.

The present invention also provides a chip structure. The chip structure mainly comprises a chip and at least a bonding pad. The chip has an active surface. The bonding pad is disposed on the active surface. The bonding pad mainly comprises a polygonal body and a plurality of first protruding portions. The polygonal body has a first planar surface and a corresponding second planar surface. The polygonal body is disposed on the chip, and the second planar surface of the polygonal body is in contact with the chip. The first protruding portions are disposed on the first planar surface at the corner regions of the polygonal body.

In the present embodiment, the bonding pad may further comprise a second protruding portion disposed on the first planar surface and positioned in the central region of the polygonal body. The second protruding portion is connected to the first protruding portions, for example. The shape of the second protruding portion, when viewed from the top against the first planar surface, may be any useful shape, such as a cross-line shape, a circular shape, a circular ring shape, an ellipse shape, an ellipse ring shape, a polygonal shape, a polygonal ring shape or any other linear or geometrical shape, or a shape of any of their combination(s). The polygonal body, the first protruding portions and the second protruding portion are formed together as an integrated unit, for example.

In the present embodiment, the bonding pad is fabricated using aluminum, and the polygonal body has a square shape, for example. The chip structure may further comprise a passivation layer disposed on the active surface of the chip covering the edge of the bonding pad but leaves the central region of the bonding pad exposed. In addition, the chip structure may further comprise at least a bump disposed on and electrically connected to the bonding pad. The bump is fabricated using a material such as gold. Furthermore, the bonding pad of the chip structure is formed in a sputtering process and the first protruding portions of the chip structure are formed in a sputtering process using a mask, for example.

The present invention also provides a pad for disposing on a chip. The pad mainly comprises a body and at least one first protruding portion. The first protruding portion is disposed on corner regions of the body.

The present invention also provides a display apparatus that includes the mentioned pad.

The present invention also provides a device that includes the mentioned pad.

In brief, the bonding pad of the present invention has a polygonal body with a plurality of first protruding portions disposed on its corner region. Hence, the corner regions of the bonding pad are strengthened to prevent possible damage to the bonding pad resulting from thermal stress when the chip is bonded to other devices. Ultimately, reliability and product yield of the chip is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
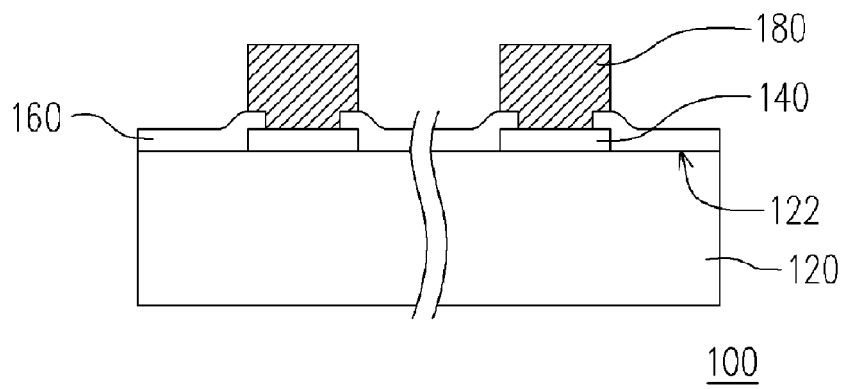
FIG. 1 is a schematic cross-sectional view of a conventional chip structure.
Figure 2:
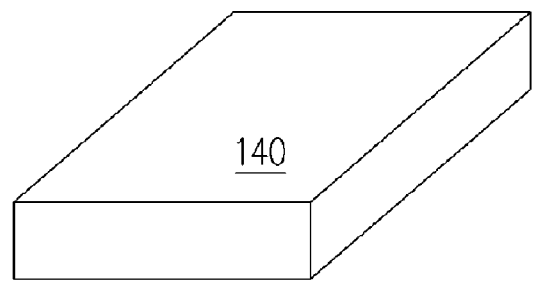
FIG. 2 is a perspective view of the bonding pad in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
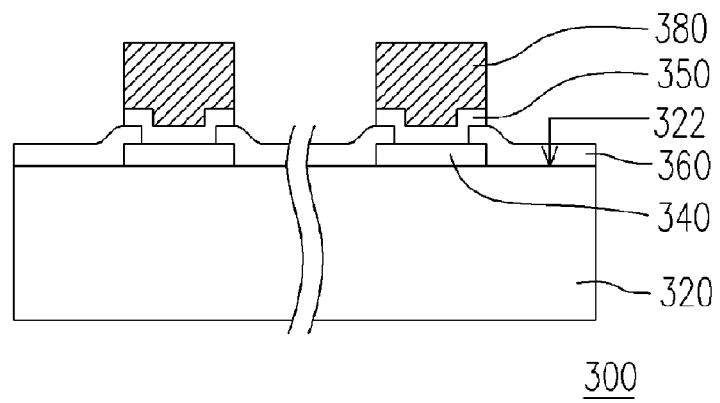
FIG. 3 is a schematic cross-sectional view of a chip structure according to one preferred embodiment of the present invention.

FIG. 3 is a schematic cross-sectional view of a chip structure according to one preferred embodiment of the present invention. The chip structure 300 in FIG. 3 mainly comprises a chip 320 and at least a bonding pad 340. The chip 320 has an active surface 322 and the bonding pad 340 is disposed on the active surface 322 of the chip 320.

In the embodiment shown in FIG. 3, the chip structure 300 may further comprise a passivation layer 360 disposed on the active surface 322 of the chip 320. The passivation layer 360 covers the peripheral region of the bonding pad 340 to prevent environmental contaminants from getting to the chip 320 but leaves the central region of the bonding pad 340 exposed. In addition, the chip structure 300 may further comprise at least a bump 380 disposed on and electrically connected to the bonding pad 340. The bump 380 can be fabricated with a material such as gold. Since a bump 380 fabricated from gold occupies a smaller volume, the density of bonding pads 340 on the chip 320 can be increased or the size of each chip 320 can be reduced. One major aspect of the chip structure 300 according to the present invention is the geometric shape of the bonding pad 340. The fine structure of a bonding pad 340 is further explained below.

Figure 4A:
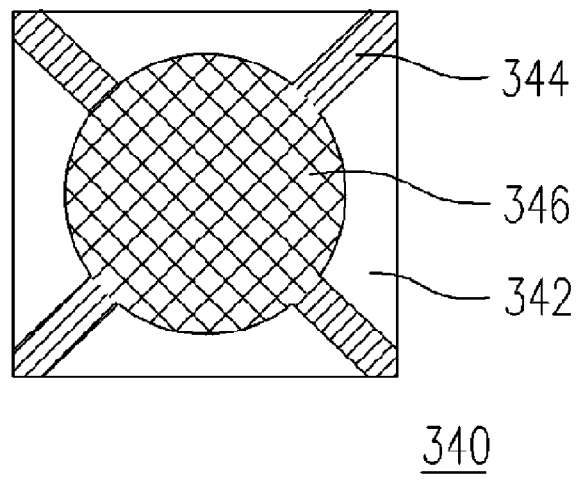
FIG. 4A is a top view of a bonding pad according to one preferred embodiment of the present invention.
Figure 4B:
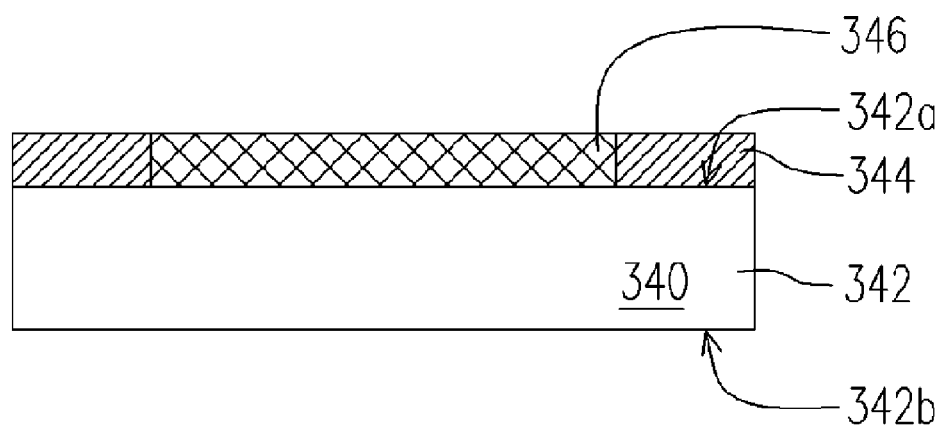
FIG. 4B is a front view of the bonding pad shown in FIG. 4A.

FIG. 4A is a top view of a bonding pad according to one preferred embodiment of the present invention. FIG. 4B is a front view of the bonding pad shown in FIG. 4A. As shown in FIGS. 4A and 4B, the bonding pad 340 comprises a polygonal body 342 and a plurality of first protruding portions 344. The bonding pad 340 can be applied to the chip structure 300 shown in FIG. 3. The polygonal body 342 has a first planar surface 342a and a corresponding second planar surface 342b. The second planar surface 342b of the polygonal body 342 is disposed on the chip 320 (shown in FIG. 3). The first protruding portions 344 are disposed on the first planar surface 342a at the corner regions of the polygonal body 342.

The bonding pad 340 may further comprise a second protruding portion 346 disposed on the first planar surface 342a in the central region of the polygonal body 342. The second protruding portion 346 is preferably connected to the first protruding portions 344. Obviously, the second protruding portion 346 can be absent from the bonding pad 340 so that the bonding pad 340 comprises the polygonal body 342 and the first protruding portions 344 only. The bonding pad 340 is fabricated using aluminum, for example. In addition, the shape of the polygonal body 342 is a four-sided figure, for example. The shape of the second protruding portion, when viewed from the top against the first planar surface, may be any useful shape, such as a cross-line shape, a circular shape, a circular ring shape, an ellipse shape, an ellipse ring shape, a polygonal (such as triangle, square, rectangle, parallelogram, pentagon, hexagon, heptagon, or octagon . . . etc.) shape, a polygonal ring shape or any other linear or geometrical shape, or a shape of any of their combination(s).

Figure 4C:
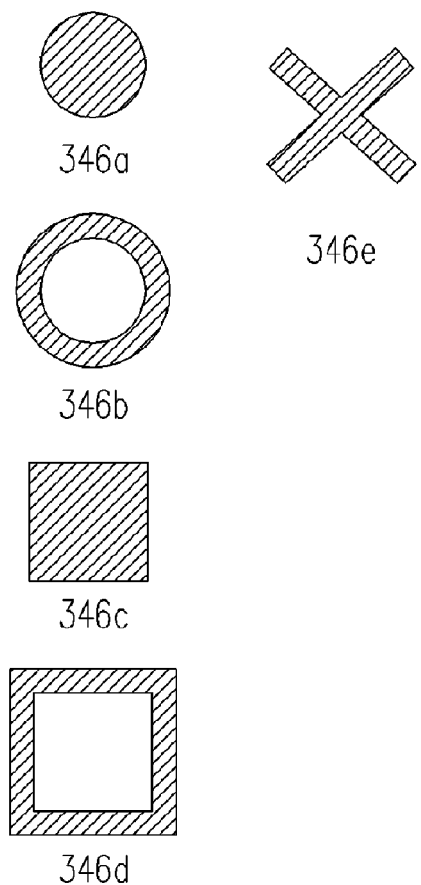
FIG. 4C is a top view showing some of possible shapes of the second protruding portions in the bonding pad according the present invention.

FIG. 4C is a top view showing some of possible shapes of the second protruding portions in the bonding pad according the present invention. As shown in FIG. 4C, the shape of the second protruding portions 346 may be a circular shape 346a, a circular ring shape 346b, a polygonal shape 346c, a polygonal ring shape 346d or a cross-line shape 346e.

Figure 5:
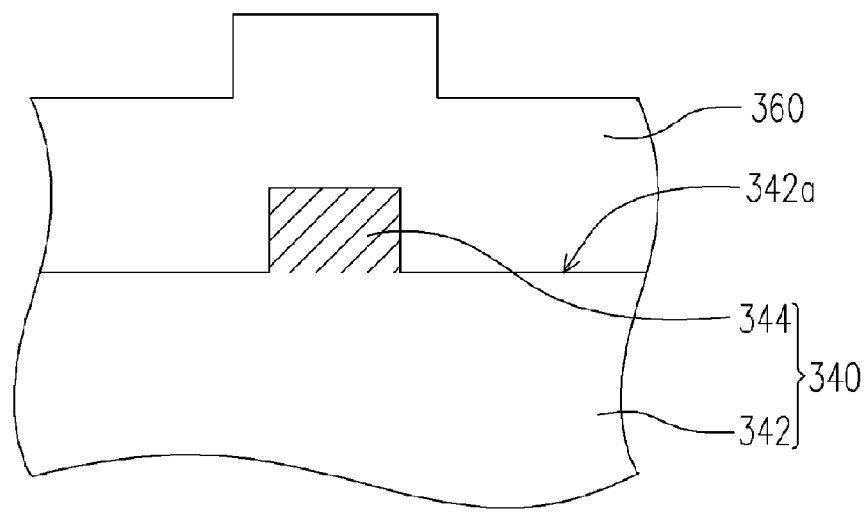
FIG. 5 is a partially magnified view showing the contact region between the bonding pad and the passivation layer according to the present invention.

FIG. 5 is a partially magnified view showing the contact region between the bonding pad and the passivation layer according to the present invention. As shown in FIGS. 3 and 5, the first protruding portions 344 effectively increase the contact area between the passivation layer 360 and the bonding pad 340. Thus, the junction between the passivation layer 360 and the bonding pad 340 is less likely to crack when the chip structure 300 is subjected to thermal stress in the process of bonding with other devices. In other words, the passivation layer 360 and the bonding pad 340 can have a more reliable connection and prevent chip failure resulting from the cracking of the passivation layer 360.

It should be noted that the bump 380 shown in FIG. 3 is not limited to a direct contact with the bonding pad 340. An adhesive layer 350 may be coated on the bonding pad 340 to increase the adhesive strength between the bump 380 and the bonding pad 340. The adhesive layer 350 can be fabricated using titanium tungsten (TiW) material, for example. Furthermore, the material constituting the bump 380 is not limited to gold. Other materials such as tin may also be deployed. In addition, the shape of the polygonal body 342 of the bonding pad 340 as shown in FIG. 4A is not limited to a four-sided figure. Other shapes of the polygonal body 342 of the bonding pad 340 are also permissible. The shape of the second protruding portions 346 is not limited to the ones shown in FIG. 4C. Other suitable geometric shapes of the second protruding portions 346 can also be used.

An aluminum sputtering process is utilized to form the first protruding portions 344 and the second protruding portion 346 in the present invention as shown in FIG. 4A. In the following, the method of fabricating the bonding pad is described in more detail.

Figure 6:
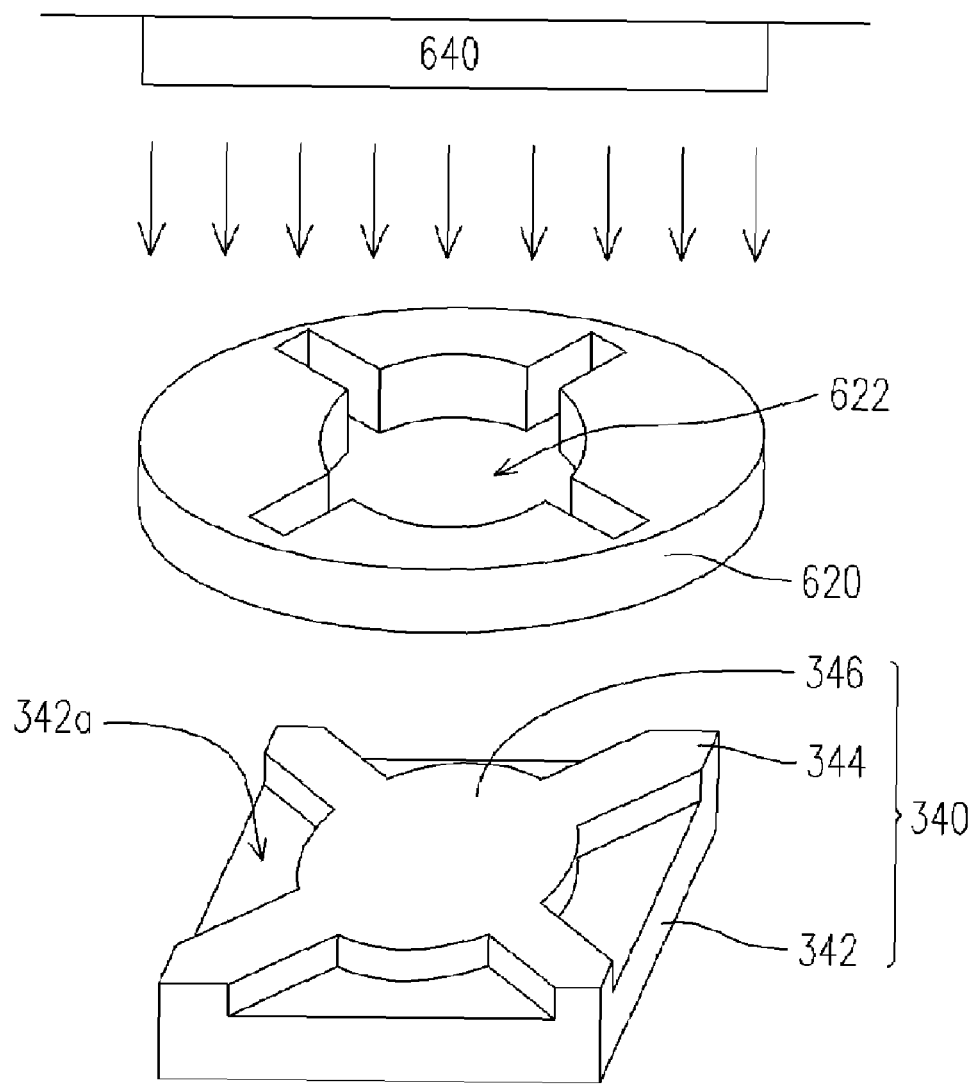
FIG. 6 is a diagram showing a method of fabricating the bonding pad according to the present invention.

FIG. 6 is a diagram showing a method of fabricating the bonding pad according to the present invention. As shown in FIG. 6, sputtering material through a mask 620 inside a sputtering machine forms the bonding pad 340. The mask 620 has at least a hollow portion 622. The hollow portion 622 has a shape identical to the shape of the first protruding portions 344 and the second protruding portion 346. In the method of forming the bonding pad 340 according to the present invention, a sputtering operation is carried out to form the polygonal body 342 of the bonding pad 340 first. Thereafter, the mask 620 is disposed between a target material board 640 and the polygonal body 342 and the sputtering operation is resumed. A portion of the material sputtered from the target material board 640 passes through the hollowed portion 622 of the mask 620 and deposited on the first planar surface 342a of the polygonal body 342.

Since the aforementioned method of fabricating the bonding pad does not need extra photomask, no additional time and cost is required for extra photomask. It should be noted that FIG. 6 only depicts a single hollow portion 622 in the mask 620 to form a single bonding pad 340. In practice, the mask 620 may include a plurality of hollow portions 622 so that a plurality of bonding pads 340 each having a corresponding set of first protruding portions 344 is formed in a single sputtering process.

In summary, the bonding pad and chip structure of the present invention has a plurality of protruding portions disposed at the corner region of the bonding pad so that the contact area between the bonding pad and a subsequently formed passivation layer is increased. With a larger contact area, the process of bonding the chip to another device is less likely to cause damages at the corner regions of the bonding pad due to the thermal stress between the bonding pad and the passivation layer. Furthermore, the disposition of a second protruding portion linking with the first protruding portions provides additional strength the bonding pad structure. In addition, there is no need to use an extra photo masking step in the fabrication of the bonding pads. Hence, no additional cost is incurred for forming the bonding pads.

Besides, the chip comprising the bonding pad may be a driver IC for an display apparatus, such as liquid crystal display (LCD), organic light-emitting diode (OLED) display, or plasma display . . . etc.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bonding pad for disposing on a chip, comprising:
    a body having a first surface and a corresponding second surface and having a central region and corner regions, wherein the body is disposed on the chip, and the second surface of the body is in contact with the chip;
    a plurality of first protruding portions disposed on the first surface at the corner regions of the body; and
    a second protruding portion disposed on the first surface in the central region of the body, wherein each of the first protruding portions extends to the central region from the corner region to connect to the second protruding portion.

2. The bonding pad of claim 1, wherein the shape of the second protruding portion when viewed from the top against the first surface is selected from the group consisting of a cross-line shape, a circular shape, a circular ring shape, an ellipse shape, an ellipse ring shape, a polygonal shape, a polygonal ring shape, a linear shape, a geometrical shape and combinations thereof.

3. The bonding pad of claim 1, wherein the materials for the body, the first protruding portion and the second protruding portion are identical.

4. The bonding pad of claim 1, wherein the materials for the body and the first protruding portion are identical.

5. The bonding pad of claim 1, wherein the material constituting the bonding pad comprises aluminum.

6. The bonding pad of claim 1, wherein the body has a four-sided geometric shape.

7. A chip structure, comprising:
    a chip having an active surface;
    at least one bonding pad disposed on the active surface of the chip, the bonding pad including:
    a body having a first surface and a corresponding second surface and having a central region and corner regions, wherein the body is disposed on the chip, and the second surface of the body is in contact wit the chip;
    a plurality of first protruding portions disposed on the first surface at the corner regions of the body; and
    a second protruding portion disposed on the first surface in the central region of the body, wherein each of the first protruding portions extends to the central region from the corner region to connect to the second protruding portion.

8. The chip structure of claim 7, wherein the shape of the second protruding portion when viewed from the top against the first surface is selected from the group consisting of a cross-line shape, a circular shape, a circular ring shape, an ellipse shape, an ellipse ring shape, a polygonal shape, a polygonal ring shape, a linear shape, a geometrical shape and combinations thereof.

9. The chip structure of claim 7, wherein the materials for the body, the first protruding portion and the second protruding portion are identical.

10. The chip structure of claim 7, wherein the materials for the body and the first protruding portion are identical.

11. The chip structure of claim 7, wherein the material constituting the bonding pad comprises aluminum.

12. The chip structure of claim 7, wherein the body has a four-sided geometric shape.

13. The chip structure of claim 7, further comprising a passivation layer disposed on the active surface of the chip that also covers the peripheral region of the bonding pad but leaves the central region of the bonding pad exposed.

14. The chip structure of claim 7, further comprising at least a bump disposed on and electrically connected with the bonding pad.

15. A pad for disposing on a chip, comprising:
a body having a central region and corner regions;
a plurality of first protruding portions disposed on the corner regions of the body; and
a second protruding portion disposed on the central region of the body, wherein each of the first protruding portions extends to the central region from the corner region to connect to the second protruding portion.

16. A display apparatus comprising a device which includes the pad of claim 15.

17. A device comprising the pad of claim 15.

* * * * *